United States Patent
Oliaei et al.

(10) Patent No.: US 8,451,046 B2
(45) Date of Patent: May 28, 2013

(54) SYSTEM AND METHOD FOR SWITCH LEAKAGE CANCELLATION

(75) Inventors: Omid Oliaei, Tempe, AZ (US); David Newman, Tempe, AZ (US)

(73) Assignee: Fujitsu Semiconductor Limited, Yokohama-shi (JP)

( * ) Notice: Subject to any disclaimer, the term of this patent is extended or adjusted under 35 U.S.C. 154(b) by 126 days.

(21) Appl. No.: 12/882,306

(22) Filed: Sep. 15, 2010

(65) Prior Publication Data

US 2012/0062307 A1 Mar. 15, 2012

(51) Int. Cl.
*H03K 17/687* (2006.01)

(52) U.S. Cl.
USPC ............ 327/427; 327/410; 327/434; 327/435

(58) Field of Classification Search
USPC .................................... 327/355–508
See application file for complete search history.

(56) References Cited

U.S. PATENT DOCUMENTS

| | | | | |
|---|---|---|---|---|
| 4,331,929 A * | 5/1982 | Yokoyama | ..................... | 330/254 |
| 4,588,909 A * | 5/1986 | Quan | ............................ | 327/362 |
| 4,804,904 A * | 2/1989 | Katakura | ....................... | 323/312 |
| 5,379,457 A * | 1/1995 | Nguyen | ......................... | 455/323 |
| 7,277,682 B2 * | 10/2007 | Zhou | .......................... | 455/127.1 |
| 7,754,380 B2 * | 7/2010 | Abe et al. | ....................... | 429/199 |
| 2003/0030480 A1* | 2/2003 | Quan | ............................. | 327/359 |
| 2004/0263236 A1* | 12/2004 | Morf et al. | .................... | 327/407 |
| 2006/0261875 A1* | 11/2006 | Breems et al. | ................ | 327/359 |
| 2009/0085645 A1* | 4/2009 | Tanaka | .......................... | 327/407 |
| 2010/0219875 A1* | 9/2010 | Chou et al. | .................... | 327/359 |
| 2011/0032022 A1* | 2/2011 | Flewelling et al. | ........... | 327/478 |

* cited by examiner

*Primary Examiner* — Lincoln Donovan
*Assistant Examiner* — Brandon S Cole
(74) *Attorney, Agent, or Firm* — Baker Botts L.L.P.

(57) ABSTRACT

In accordance with embodiments of the present disclosure, a circuit may include a transmission switch and a dummy switch coupled at its output to the output of the transmission switch. The transmission switch may be configured to be selectively enabled and disabled based on a control signal received at a gate of the transmission switch. The transmission switch may be further configured to receive a first polarity of a differential signal at its input and pass the first polarity of the differential signal to its output when enabled. The dummy switch may be configured to be disabled and to receive a second polarity of the differential signal at its input, the second polarity of opposite polarity of the first polarity.

20 Claims, 4 Drawing Sheets

SYSTEM AND METHOD FOR SWITCH LEAKAGE CANCELLATION

TECHNICAL FIELD

The present disclosure relates generally to wireless communication and, more particularly, to cancelling switch leakage of wireless communication devices.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Certain components of a transmitter or receiver (e.g., power amplifiers and/or automatic gain control circuits of variable gain amplifiers) may employ electronic switches. Generally speaking, an ideal switch is an electrical component that may selectively open an electrical circuit (e.g., turning the switch "off," thereby interrupting current in the circuit) or close the electrical circuit (e.g., turning the switch "on," thereby providing a path for current in the circuit). In practical applications, and particularly at high frequencies and radio frequencies, switches do not typically act in an ideal manner, and may conduct a small amount of current even when off, a phenomenon known as leakage. While an amount of current due to leakage may be small enough to be ignored in some applications, in other applications (e.g., radio-frequency applications) the leakage current may be large enough that it may lead to undesirable effects in a circuit unless compensated, corrected, or cancelled.

SUMMARY

In accordance with embodiments of the present disclosure, a circuit may include a transmission switch and a dummy switch coupled at its output to the output of the transmission switch. The transmission switch may be configured to be selectively enabled and disabled based on a control signal received at a gate of the transmission switch. The transmission switch may be further configured to receive a first polarity of a differential signal at its input and pass the first polarity of the differential signal to its output when enabled. The dummy switch may be configured to be disabled and to receive a second polarity of the differential signal at its input, the second polarity of opposite polarity of the first polarity.

Technical advantages of one or more embodiments of the present disclosure may include a circuit that reduces or eliminates the effect of leakage currents in switches.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
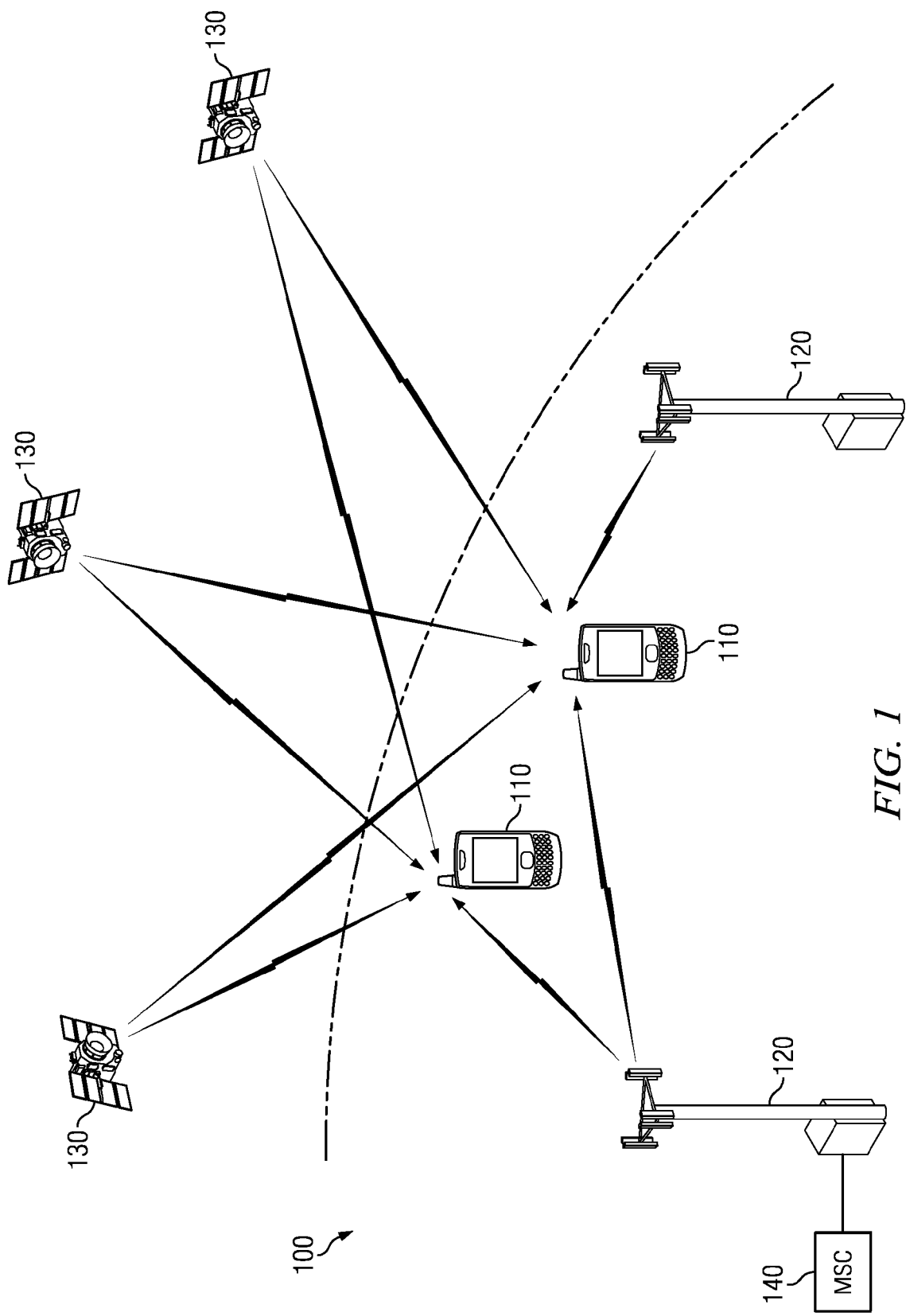
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
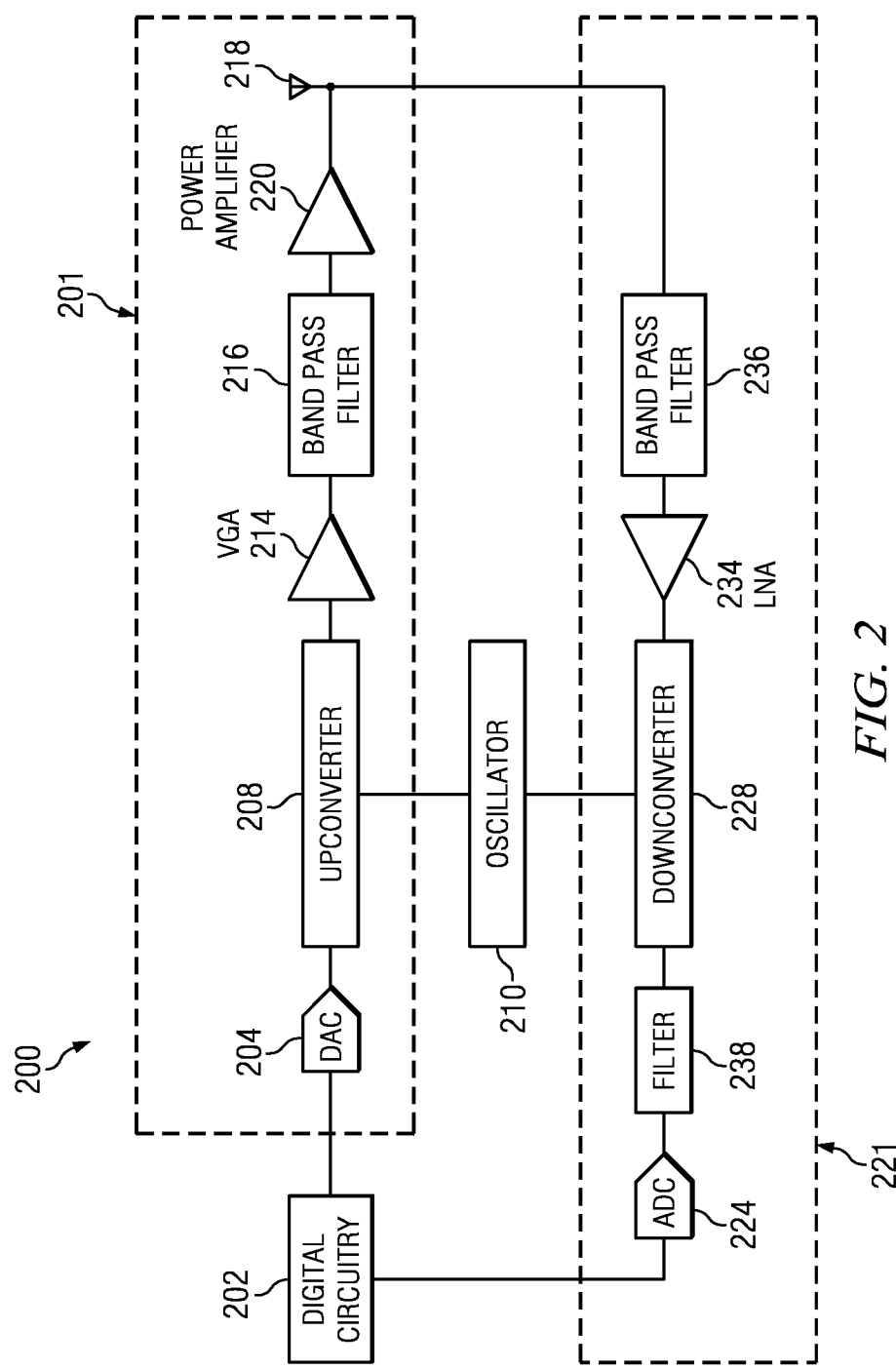
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

As mentioned previously, certain components of transmit path 201 may include switches. For example, variable gain amplifier 214 may include a gain control stage having switches to switch between different gain values. In addition, some embodiments of element 200 may include fan-out switches configured to distribute a signal to one or more power amplifiers 220.

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

Figure 3A:
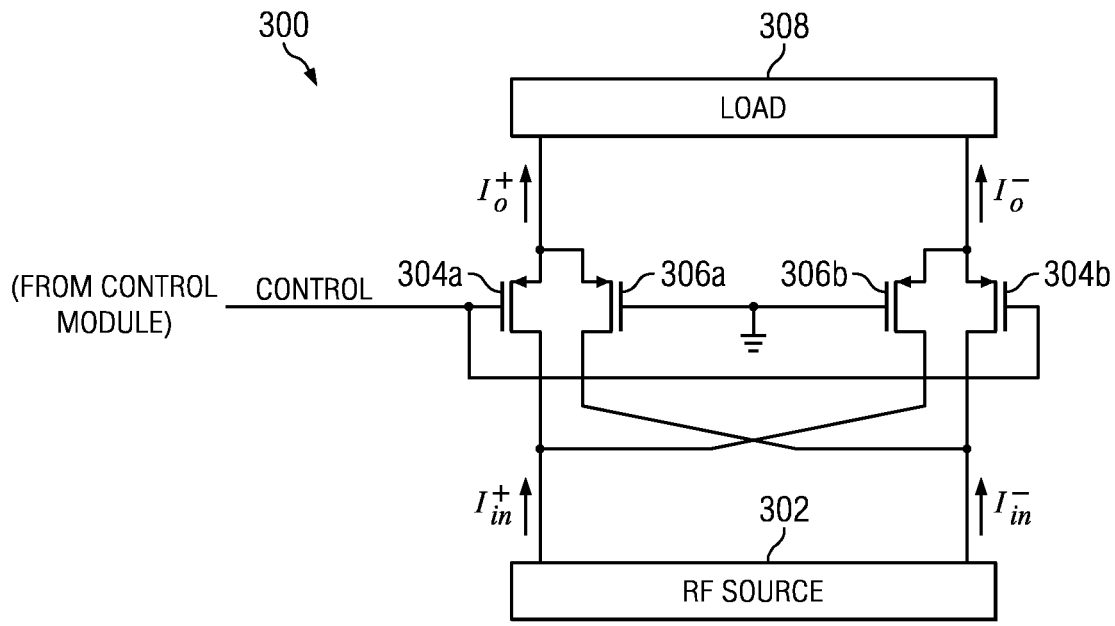
FIG. 3A illustrates a block diagram of an example differential-mode circuit for cancellation of switch leakage, in accordance with certain embodiments of the present disclosure.

FIG. 3A illustrates a block diagram of an example differential-mode circuit 300 for cancellation of switch leakage, in accordance with certain embodiments of the present disclosure. As shown in FIG. 3A, a radio frequency source 302 (e.g., an upconverter) may output a differential current signal, represented by positive polarity current $I_{in}^+$ and negative polarity current $I_{in}^-$.

Differential-mode circuit 300 may include two transmission switches 304 (e.g., transmission switches 304a and 304b) and two dummy switches 306 (e.g., dummy switches 306a and 306b). A switch 304, 306 may include any system, device, or apparatus configured to selectively complete or open a circuit between its input and output based on a switching control signal received by such switch 304, 306. A switch 304, 306 may be implemented in any suitable manner, including without limitation a switching circuit, one or more combinatorial gates, one or more p-type MOSFETs, one or more n-type MOSFETs, and/or one or more transmission gates.

As shown in FIG. 3A, one transmission switch 304 may be configured such that it receives positive polarity current $I_{in}^+$ at its input and is coupled at its output to a first terminal of a load 308 (e.g., a positive polarity input terminal of load 308), and the other transmission switch 304 may be configured such that it receives negative polarity current $I_{in}^-$ at its input and is coupled at its output to a second terminal of a load 308 (e.g., a negative polarity input terminal of load 308). Each transmission switch 304 may be coupled to receive a control signal at its gate, such control signal configured to selectively enable and disable transmission switches 304. Also as depicted in FIG. 3A, each dummy switch 306 may be cross-coupled to transmission switches 304 such that each dummy switch 306 is coupled at its input to the input of a first transmission switch 304, and coupled at its output to the output of a second transmission switch 304. Each dummy switch 306 may be configured such that its gate is tied to a ground voltage, such that the dummy switch 306 if always disabled or "off."

In operation, a transmission switch 304 may be configured to selectively open or close a path between radio frequency source 302 and a load 308 based on a control signal received from a control module. Accordingly, when switches 304 are enabled (e.g., control signal of a logic 1 or "high" voltage is applied to gates of switches 304), paths may be completed such that a differential current signal received by load 308 is approximately equal to the differential current signal output by radio frequency source 302. In other words, when switches 304 are enabled, $I_{in}^+ \approx I_o^+$ and $I_{in}^- \approx I_o^-$. In addition, when switches 304 are disabled, (e.g., control signal of a logic 0 or "low" voltage is applied to gates of switches 304), paths between radio-frequency source 302 and load 308 may be opened such that $I_o^+ \approx 0$ and $I_o^- \approx 0$.

As discussed above, switches such as transmission switches 304 may have leakage current when turned off or disabled, such that $I_o^+ \neq 0$ and $I_o^- \neq 0$ when transmission switches 304 are disabled. However, as configured in FIG. 3A, similar leakage currents of opposite polarity may flow through dummy switches 306, thus partially or fully cancelling leakage current of transmission switches 304. To illustrate, the leakage current through transmission switch 304a when switch 304a is disabled may be a fraction of the current $I_{in}^+$, such that the current through switch 304a may be represented by $K_T I_{in}^+$, where $K_T$ is a constant that may be dependent upon the physical properties (e.g., sizing, carrier concentration, etc.) of switch 304. Similarly, the leakage current through dummy switch 306a may be a fraction of the current $I_{in}^-$, such that the current through switch 306a may be represented by $K_D I_{in}^-$, where $K_D$ is a constant that may be dependent upon the physical properties (e.g., sizing, carrier concentration, etc.) of switch 306. If the physical properties of switches 304a and 306 are approximately identical, then $K_T \approx K_D$. In addition, because $I_{in}^+$ is of opposite polarity of $I_{in}^-$, $I_{in}^+ \approx -I_{in}^-$. The current $I_o^+$ when switch 304a is disabled is equal to the sum of the leakage currents through switches 304a and 306a, or stated as an equation, $I_o^+ = K_T I_{in}^+ + K_D I_{in}^- \approx 0$. For reasons analogous to those set forth above, a leakage current through dummy switch 306b may also partially or fully cancel a leakage current through transmission switch 304b.

Figure 3B:
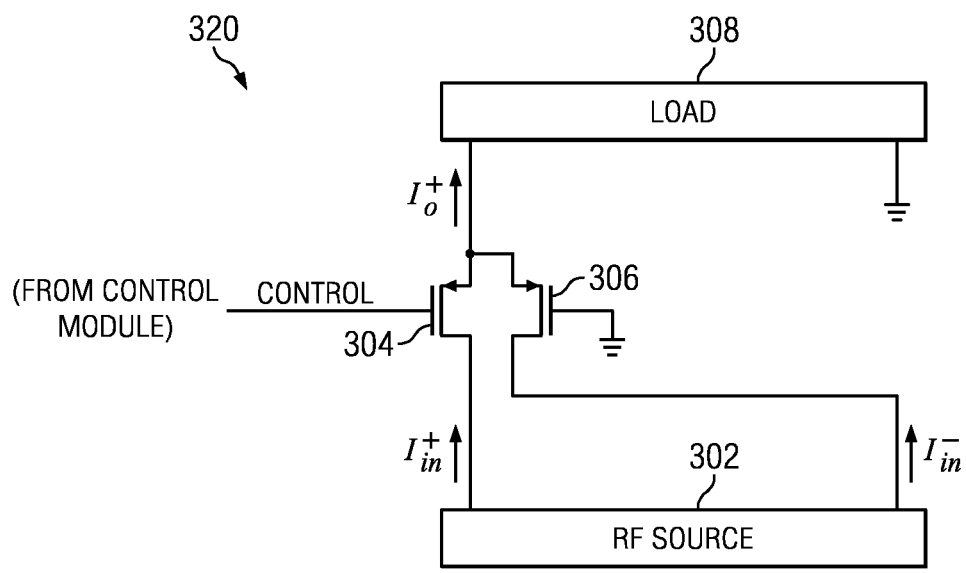
FIG. 3B illustrates a block diagram of an example single-ended-mode circuit for cancellation of switch leakage, in accordance with certain embodiments of the present disclosure.

FIG. 3B illustrates a block diagram of an example single-ended-mode circuit 320 for cancellation of switch leakage, in accordance with certain embodiments of the present disclosure. As depicted, single-ended-mode circuit 320 is similar to differential-mode circuit 300, except that single-ended-mode circuit 320 includes a single transmission switch 304 and a single dummy switch 306.

As shown in FIG. 3B, transmission switch 304 may be configured such that it receives a current of a first polarity (e.g., positive polarity current $I_{in}^+$) at its input and is coupled at its output to a first terminal of a load 308. Transmission switch 304 may be coupled to receive a control signal at its gate, such control signal configured to selectively enable and disable transmission switch 304. Also as depicted in FIG. 3B, dummy switch 306 may be cross-coupled to transmission switch 304 such that dummy switch 306 receives a current of a second polarity opposite to the first polarity (e.g., negative polarity current $I_{in}^-$) at its input and is coupled at its output to the output of transmission switch 304. Dummy switch 306 may be configured such that its gate is tied to a ground voltage, such that the dummy switch 306 if always disabled or "off." A second terminal of load 308 may be coupled to a ground voltage.

In operation, transmission switch 304 may be configured to selectively open or close a path between radio frequency source 302 and a load 308 based on a control signal received from a control module. Accordingly, when switch 304 is enabled (e.g., control signal of a logic 1 or "high" voltage is applied to the gate of switch 304), a path may be completed such that a single-ended current signal received by load 308 is approximately equal to the a current signal output by radio frequency source 302. In other words, when switch 304 is enabled, $I_{in}^+ \approx I_o^+$. In addition, when switch 304 is disabled, (e.g., control signal of a logic 0 or "low" voltage is applied to the gates of switch 304), the path between radio-frequency source 302 and load 308 may be opened such that $I_o^+ \approx 0$.

As configured in FIG. 3B, the leakage current of transmission switch 304 when switch 304 is disabled may be partially or fully cancelled by similar leakage currents of opposite polarity flowing through dummy switch 306, in a similar manner as that discussed above with respect to differential-mode circuit 300 of FIG. 3A.

Figure 4:
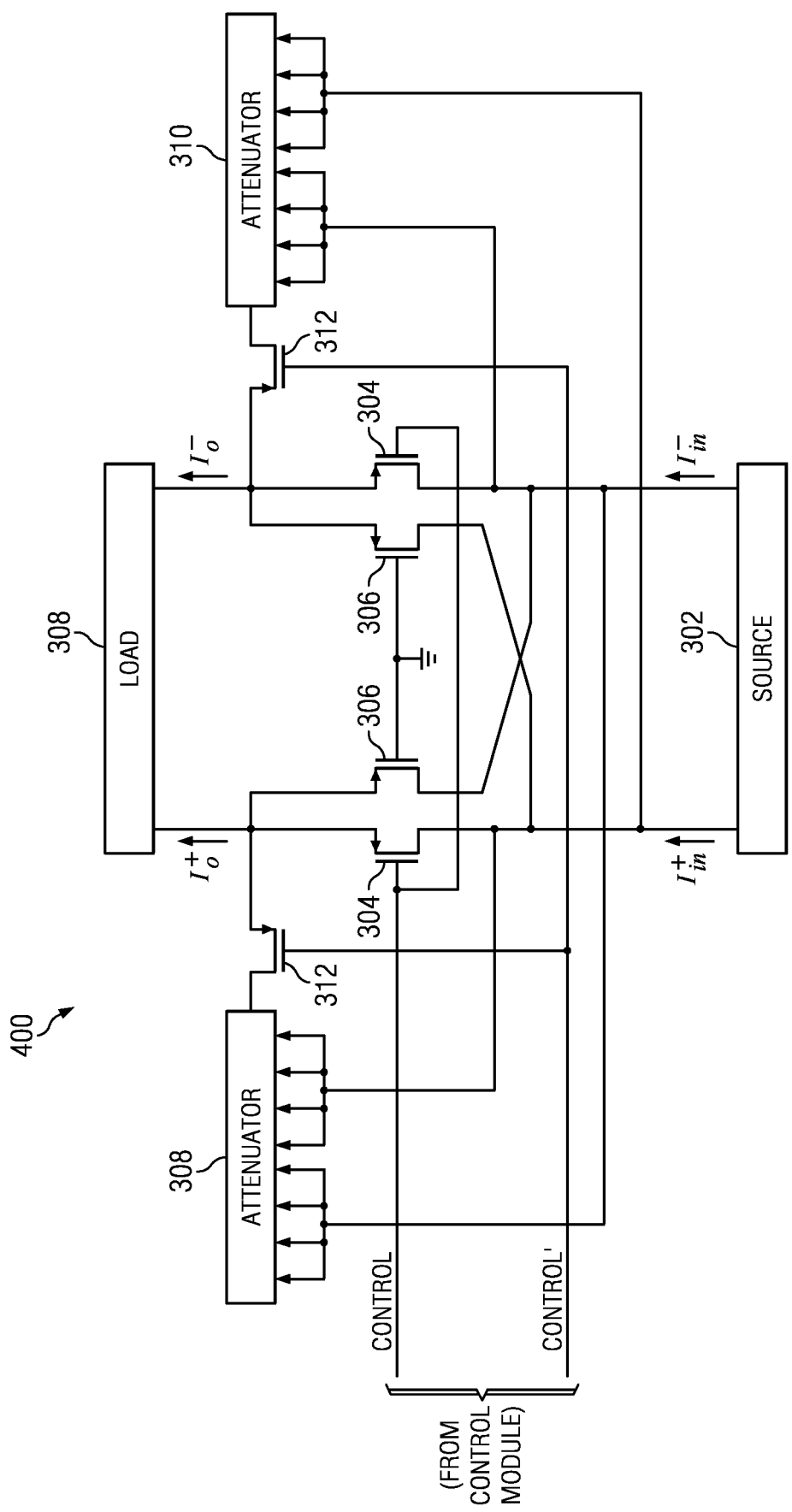
FIG. 4 illustrates a block diagram of an example automatic gain control circuit including circuitry for cancellation of switch leakage, in accordance with certain embodiments of the present disclosure.

Although the switch leakage cancellation techniques disclosed herein may be used in a wide variety of applications, and example application is shown in FIG. 4. FIG. 4 illustrates a block diagram of an example automatic gain control (AGC) circuit 400 including circuitry for cancellation of switch leakage, in accordance with certain embodiments of the present disclosure. As depicted in FIG. 4, automatic gain control circuit 400 may include transmission switches 304 and dummy switches 306 cross-coupled to transmission switches 304 similar to that depicted in differential-mode circuit 300 of FIG. 3A. Transmission switches 304 and dummy switches 306 may be configured with respect to source 302 and load 308 in a manner similar to that depicted in differential-mode circuit 300 of FIG. 3A. Additionally, gates of transmission switches 304 may be configured to receive a control signal for selectively enabling and disabling of transmission switches 304, in a manner similar to that depicted in differential-mode circuit 300 of FIG. 3A AGC circuit 400 may also include attenuators 310 and transmission switches 312. An attenuator 310 may be any system, device or apparatus that may reduce the amplitude or power of a signal (e.g., the differential current signal produced by source 302) without appreciably distorting its waveform. Attenuator 310 may receive as input the differential current signal provided by source 302, and based on the amplitude or power of such current signal, output an amplitude-attenuated version of the current signal. In some embodiments, AGC circuit 400 may be an integral part of a variable gain amplifier (e.g., variable gain amplifier 214).

A transmission switch 312 may include any system, device, or apparatus configured to selectively complete or open a circuit between its input and output based on a switching control signal received by such switch 312. A switch 312 may be implemented in any suitable manner, including without limitation a switching circuit, one or more combinatorial gates, one or more p-type MOSFETs, one or more n-type MOSFETs, and/or one or more transmission gates.

As shown in FIG. 4, a transmission switch 312 may be configured such that it receives at its input the output of an attenuator 310. A transmission switch may also be configured such that it is coupled at its output to the output of a transmission switch 304. Each transmission switch 312 may be coupled to receive a control signal at its gate, such control signal configured to selectively enable and disable transmission switches 312. As shown in FIG. 4, the control signal for enabling and disabling of transmission switches 312 may be the inverse of that for enabling and disabling of transmission switches 304. Accordingly, switches 304 may be enabled when switches 312 are disabled, and vice versa. Consequently, control signals may selectively allow the full-strength differential voltage from source 302 to pass to load 308 (transmission switches 304 enabled, transmission switches 312 disabled) or allow an attenuated source signal to pass to load 308 (transmission switches 304 disabled, transmission switches 312 enabled). In the case in which the attenuated signal path is selected, leakage currents of cross-coupled dummy switches 306 may partially or fully cancel leakage currents of transmission switches 304 (e.g., in a manner similar to that as described above with respect to circuits 300 and 320 of FIGS. 3A and 3B), such that the effect of leakage currents upon the attenuated source signals passed to load 308 may be minimal.

Modifications, additions, or omissions may be made to system 100 from the scope of the disclosure. The components of system 100 may be integrated or separated. Moreover, the operations of system 100 may be performed by more, fewer, or other components. As used in this document, "each" refers to each member of a set or each member of a subset of a set.

Although the present disclosure has been described with several embodiments, various changes and modifications may be suggested to one skilled in the art. It is intended that the present disclosure encompass such changes and modifications as fall within the scope of the appended claims.

What is claimed is:

1. A circuit, comprising:
    a transmission switch configured to be selectively enabled and disabled based on a binary control signal received at a gate of the transmission switch, and further configured to:
        receive a first polarity of a differential signal at its input; and
        pass the first polarity of the differential signal to its output when enabled; and
    a dummy switch coupled at its output to the output of the transmission switch and configured to be disabled during the entirety of operation of the circuit and to receive a second polarity of the differential signal at its input, the second polarity of opposite polarity of the first polarity.

2. A circuit according to claim 1, wherein the differential signal is a current signal.

3. A circuit according to claim 1, wherein a physical characteristic of the transmission switch is approximately identical to that of the dummy switch.

4. A circuit according to claim 1, wherein the sum of an output signal on the output of the dummy switch and an output signal on the output of the transmission switch are approximately zero when the transmission switch is disabled.

5. A circuit according to claim 1, wherein the dummy switch is disabled by coupling a gate of the dummy switch to a direct current ground voltage.

6. A circuit according to claim 1, wherein an output signal on the output of the transmission switch comprises a single-ended-mode output signal for transmission to a load of the circuit.

7. A circuit according to claim 1, further comprising:
    a second transmission switch configured to configured to be selectively enabled and disabled based on the control signal, and further configured to:
        receive the second polarity of the differential signal at its input; and
        pass the second polarity of the differential signal to its output when enabled; and
    a second dummy switch coupled at its output to the output of the second transmission switch and configured to be disabled during the entirety of operation of the circuit and to receive the first polarity of the differential signal at its input.

8. A circuit according to claim 7, wherein:
    an output signal on the output of the first transmission switch comprises a first polarity of a differential-mode output signal for transmission to a load of the circuit; and
    an output signal on the output of the second transmission switch comprises a second polarity of the differential-mode output signal, the second polarity of the differential-mode output signal of opposite polarity of the first polarity of the differential-mode output signal.

9. A wireless communication element, comprising:
    at least one of:
        a receive path configured to receive a first wireless communication signal and convert the first wireless communication signal into a first digital signal based at least on an oscillator signal; and
        a transmit path configured to convert a second digital signal into a second wireless communication signal based at least on the oscillator signal and transmit the second wireless communication signal;
    wherein at least one of the receive path and the transmit path comprises a circuit including:
        a transmission switch configured to be selectively enabled and disabled based on a binary control signal received at a gate of the transmission switch, and further configured to:
            receive a first polarity of a differential signal at its input; and
            pass the first polarity of the differential signal to its output when enabled; and
        a dummy switch coupled at its output to the output of the transmission switch and configured to be disabled during the entirety of operation of the wireless communication element and to receive a second polarity of the differential signal at its input, the second polarity of opposite polarity of the first polarity.

10. A wireless communication element according to claim 9, wherein the differential signal is a current signal.

11. A wireless communication element according to claim 9, wherein a physical characteristic of the transmission switch is approximately identical to that of the dummy switch.

12. A wireless communication element according to claim 9, wherein the sum of an output signal on the output of the dummy switch and an output signal on the output of the transmission switch are approximately zero when the transmission switch is disabled.

13. A wireless communication element according to claim 9, wherein the dummy switch is disabled by coupling a gate of the dummy switch to a direct current ground voltage.

14. A wireless communication element according to claim 9, wherein an output signal on the output of the transmission switch comprises a single-ended-mode output signal for transmission to a load of the circuit.

15. A wireless communication element according to claim 9, the circuit further including:
    a second transmission switch configured to configured to be selectively enabled and disabled based on the control signal, and further configured to:
        receive the second polarity of the differential signal at its input; and
        pass the second polarity of the differential signal to its output when enabled; and
    a second dummy switch coupled at its output to the output of the second transmission switch and configured to be disabled during the entirety of operation of the wireless communication element and to receive the first polarity of the differential signal at its input.

16. A wireless communication element according to claim 15, wherein:
    an output signal on the output of the first transmission switch comprises a first polarity of a differential-mode output signal for transmission to a load of the circuit; and
    an output signal on the output of the second transmission switch comprises a second polarity of the differential-mode output signal, the second polarity of the differential-mode output signal of opposite polarity of the first polarity of the differential-mode output signal.

17. A method comprising:
    coupling an output of a dummy switch to an output of a transmission switch;
    disabling the dummy switch;

configuring the transmission switch to:
- be selectively enabled and disabled based on a binary control signal received at a gate of the transmission switch;
- receive a first polarity of a differential signal at its input; and
- pass the first polarity of the differential signal to its output when enabled; and configuring the dummy switch to receive a second polarity of the differential signal at its input, the second polarity of opposite polarity of the first polarity.

18. A method according to claim 17, wherein the differential signal is a current signal.

19. A method according to claim 17, further comprising selecting the transmission switch and the dummy switch such that the sum of an output signal on the output of the dummy switch and an output signal on the output of the transmission switch are approximately zero when the transmission switch is disabled.

20. A method according to claim 17, further comprising:
- coupling an output of a second dummy switch to an output of a second transmission switch;
- disabling the second dummy switch;
- configuring the second transmission switch to:
  - be selectively enabled and disabled based on a control signal received at a gate of the second transmission switch;
  - receive the second polarity of the differential signal at its input; and
  - pass the second polarity of the differential signal to its output when enabled; and
- configuring the dummy switch to receive the first polarity of the differential signal at its input.

* * * * *